United States Patent
Singer et al.

(10) Patent No.: US 10,074,544 B2
(45) Date of Patent: Sep. 11, 2018

(54) DEVELOPER FREE POSITIVE TONE LITHOGRAPHY BY THERMAL DIRECT WRITE

(71) Applicant: Massachusetts Institute of Technology, Cambridge, MA (US)

(72) Inventors: Jonathan Phillip Singer, Cambridge, MA (US); Pao Tai Lin, Brighton, MA (US); Edwin Lorimer Thomas, Houston, TX (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 688 days.

(21) Appl. No.: 14/256,419

(22) Filed: Apr. 18, 2014

(65) Prior Publication Data
US 2015/0303064 A1    Oct. 22, 2015

Related U.S. Application Data (60) Provisional application No. 61/814,889, filed on Apr. 23, 2013.

(51) Int. Cl.
*G03F 7/20* (2006.01)
*H01L 21/308* (2006.01)
*G03F 1/68* (2012.01)

(52) U.S. Cl.
CPC ............ *H01L 21/308* (2013.01); *G03F 1/68* (2013.01); *G03F 7/70383* (2013.01)

(58) Field of Classification Search
CPC .................................................. G03F 7/70383
See application file for complete search history.

(56) References Cited

U.S. PATENT DOCUMENTS

| | | | |
|---|---|---|---|
| 7,611,985 B2 | 11/2009 | Matayabas, Jr. et al. |
| 8,465,910 B2 | 6/2013 | Singer et al. |
| 8,565,910 B2 | 10/2013 | Behm et al. |
| 8,632,670 B2 | 1/2014 | Garimella et al. |
| 2010/0133716 A1 | 6/2010 | Winkel et al. |
| 2010/0145491 A1 | 6/2010 | Trojan |
| 2011/0259860 A1 | 10/2011 | Bass et al. |

(Continued)

FOREIGN PATENT DOCUMENTS

| | | | |
|---|---|---|---|
| JP | 11-065099 A | | 3/1999 |
| KR | 20100042815 A | * | 4/2010 |
| WO | 2014/031432 A1 | | 2/2014 |

OTHER PUBLICATIONS

Machine Translation of KR20100042815.*

(Continued)

*Primary Examiner* — Christopher T Schatz
(74) *Attorney, Agent, or Firm* — Nutter McClennen & Fish LLP (57) ABSTRACT

A method for lithographic patterning of thin films. A thin film is deposited on a substrate and the film is exposed to optical energy from a focused laser to induce a thermal gradient in the film by optical absorption. The film is softened through a melting or glass transition process and the thermal gradient induces a directional dewetting down the thermal gradient. The invention permits developer free positive tone lithography by thermal direct write and also metrology of the thin film by the morphology of the resultant features.

33 Claims, 10 Drawing Sheets

(56) References Cited

U.S. PATENT DOCUMENTS

2013/0040070 A1 2/2013 Jung et al.
2014/0054822 A1 2/2014 Ellison et al.

OTHER PUBLICATIONS

"International Preliminary Report on Patentability" for PCT/US2014/034910, dated Oct. 27, 2015.

Gunther Reiter, "Dewetting of thin polymer films", Physical Review Letters, Jan. 1, 1992, p. 75-78, 68(1), American Physical Society.

Justin Trice et al., "Pulsed-laser-induced dewetting in nanoscopic metal films: Theory and experiments," Physical Review B, Jun. 1, 2007, 75(23), American Physical Society.

Shaida Ibrahim et al., "Direct-Write Multiphoton Photolithography: A Systematic Study of the Etching Behaviors in Various Commercial Polymers", Langmuir, Nov. 1, 2007, 23(24), American Chemical Society.

Gat, A., Gerzberg, L., Gibbons, J.F., Magee, T.J., Peng, J., & Hong, J.D., CW Laser Anneal of Polycrystalline Silicon: Crystalline-Structure, Electrical-Properties, Applied Physics Letters, 1978, 775-8, 33(8), AIP Publishing, United States.

Jaw-Luen, T. & Ming-An, T., Rapid Formationa of Block Copolymer Thin Film Based on Infrared Laser Irradiation, Conference on Lasers and Electro-Optics-Pacific Rim, 2007, Thp_082, Korea.

Jung, B., Sha, J., Paredes, F., Ober, C.K., Thompson, M.O., Chandhok, M., & Younkin, T.R., Submillisecond Postexposure Bake of Chemically Amplified Resists by Co2 Laser Heat Treatment, Proceedings of Spie 7639, 2010, 763901-76399, Spie, United States.

Singer, J.P., Lin, P., Kooi, S.E., Kimerling, L.C., Michel, J., & Thomas, E.L., Direct-White Thermocapillary Dewetting of Polymer Thin Film by a Laser-Induced Thermal Gradient, Advanced Materials, 2013, 6100-5, 25, Wiley-Vch Verlag Gmbh & Co. Kgaa, Germany.

Singer, J.P., Kooi, S.E., & Thomas, E.L., Focused Laser Spike (Flask) Annealing of Photoactivated Chemically Amplified Resists for Rapid Hierarchical Patterning, Nanoscale, 2011, 2730-8, 3, The Royal Society of Chemistry, United Kingdom.

Trice, J., Thomas, D., Favazza, C., Sureshkumar, R., & Kalyanaraman, R., Pulsed-Laser-Induced Dewetting in Nanoscopic Metal Films: Theory and Experiments, Physical Review B, 2007, 2354391-8, 75, The American Physical Society, United States.

Du, B., Xie, F., Wang, Y., Yang, Z., Tsui, O.K.C., Dewetting of Polymer Films with Built-In Topographical Defects. Langmuir, 2002, 8510-7, 18, American Chemical Society, United States.

Brochard, F., Motions of Droplets on Solid Surfaces Induced by Chemical or Thermal Gradients, Langmuir, 1989, 432-8, American Chemical Society, United States.

Ludviksson, V. & Lightfoot, E.N., The Dynamics of Thin Liquid Films in the Presence of Surface-Tension Gradients, Alche Journal, 1971, 1166-73, 17(5), Alche, United States.

Darhuber, A.A., Valentino, J.P., Davis, D.M., Troian, S.M., Microfluidic Actuation by Modulation of Surface Stresses, Applied Physics Letters, 2003, 657-9, 82(4), American Institute of Physics, United States.

McLeod , E., Liu, Y., Troian, S.M., Experimental Verification of the Formation Mechanism for Pillar Arrays in Nanofilms Subjects to Large Thermal Gradients, Physical Review Letters, 2011, 1755011-4, 106, American Physical.

Dietzel, M., Troian, S.M., Mechanism for Spontaneous Growth of Nanopillar Arrays in Ultrathin Films Subject to a Thermal Gradient, Journal of Applied Physics, 2010, 0743081-8, 108, Aip Publishing, United States.

Dammel, R.R., & Norwood, R.A., Modeling of Bottom Anti-Reflection Layers: Sensitivity to Optical Constants, Advances in Resist Technology and Processing XIII, 1996, 754-69, Spie, United States.

Shanks, H.R., Maycock, P.D., Sidles, P.H., & Danielson, G.C., Thermal Conductivity of Silicon From 300 to 1400° K, Physical Review, 1963, 1743-8, 130(5), American Physical Society, United States.

Jellison, G.E., Modine, F.A., Optical Absorption of Silicon Between 1.6 and 4.7 Ev at Elevated Temperatures, Applied Physics Letters, 1982, 180-2, 41, American Institute of Physics, United States.

Lo, H.W. & Compaan, A., Taman Measurements of Temperature During Cw Laser Healing of Silicon, Journal of Applied Physics, 1980, 1565-8, 51, American Institute of Physics, United States.

Singer, J.P., Gotrik, K.W., Lee, J., Kooi, S.E., Ross, C.A., Thomas, E.L., Alignment and Reordering of a Block Copolymer by Solvent-Enhanced Thermal Laser Direct Write, Polymer, 2014, 1875-82, 55, Elsevier Ltd.

Baumgart, P., A new laser texturing technique for high performance magnetic disc drives. IEEE Transactions on Magnetics, vol. 31, Issue 6, Nov. 1995, pp. 2946-2951.

Bennett, T.D., et al., Marangoni mechanism in pulsed laser texturing of magnetic disk substrates. Journal of Heat Transfer, vol. 119, Issue 3, Aug. 1997, pp. 589-596.

Chen, S., et al., Photothermal displacement measurement of transient melting and surface deformation during pulsed laser heating. Applied Physics Letters, American Institute of Physics, vol. 73, Issue 15, Oct. 1998, pp. 2093-2095.

Lyutakov, O., et al., Regular surface grating on doped polymer induced by laser scanning. Applied Physics Letters, American Institute of Physics, vol. 95, Issue 17, 2009, pp. 173103.1-1731033.

Lyutakov, O., et al., The manipulation of carbon nanotubes on a polymer surface using a laser beam. Journal of Materials Science, vol. 47, Issue 11, Jun. 2012, pp. 4585-4588.

International Search Report and Written Opinion for Application No. PCT/US2014/034910, dated Jul. 28, 2014 (10 Pages).

Rathsack, B.M., et al., Lithography simulation of Sub-0.30 micron resist features for photomask fabrication using I-line optical pattern generators. BACUS Symposium on Photomask Technology, Sep. 1999, SPIE vol. 3873, pp. 484-492.

\* cited by examiner

DEVELOPER FREE POSITIVE TONE LITHOGRAPHY BY THERMAL DIRECT WRITE

This application claims priority to provisional application Ser. No. 61/814,889 filed Apr. 23, 2013, the contents of which are incorporated herein by reference.

This invention was made with government support under contract number W911NF-07-D-0004 awarded by the Army Research Office. The government has certain rights in the invention.

BACKGROUND OF THE INVENTION

This invention relates to lithography and more particularly to developer free positive tone lithography by thermal direct write.

Laser spike annealing (LSA) is a prior art alternative to standard thermal treatment in semiconductor technology.[1] In this technique, a high intensity continuous wave (CW) or pulse laser is rapidly scanned across an absorbing surface, such as a silicon wafer. As semiconductor materials generally possess high thermal conductivities, the local temperature at the laser spot spikes to a high value and then, once the laser light is removed, very rapidly drops back to ambient temperature. As a result, both the temperature and annealing time can be precisely controlled by selection of laser intensity and exposure time. Additionally, annealing can be performed while kinetically avoiding unwanted effects, such as diffusion of the gates. More recently LSA has been applied to the annealing of soft materials for the phase separation of block copolymers (BCPs)[2] and chemically amplified resist (CAR) post-baking.[3]

An object of the present invention is to turn prior art broad-focus LSA into a tightly focused direct write technique, as we have recently reported.[4]

SUMMARY OF THE INVENTION

The method according to the invention for lithographic patterning of thin films includes depositing a film of less than about 500 nm thickness of material that contains at least one non-metallic component on a substrate and exposing the thin film to optical energy from a focused laser to increase film temperature and to induce a thermal gradient in the film by optical absorption. The temperature increase softens the film through a melting or glass transition process and the thermal gradient induces a directional dewetting down the thermal gradient. In a preferred embodiment, the increase in film temperature arises from optical absorption of the substrate. It is preferred but not necessary that the focused laser have a selected focal shape such as Gaussian or toroidal.

Another embodiment includes adjacent or overlapping exposures to change film thickness to produce antireflection effects to generate hotspots away from the main focus. The adjacent or overlapping exposures generate thermal gradients to push material toward previously formed features in cooler regions.

In another preferred embodiment, the thin film includes multiple layers having different properties. It is preferred but not necessary that the multiple layers dewet at different rates. Another embodiment includes a resist having nanoparticles incorporated therein. Another embodiment includes a polymer swollen in solvent vapor to control thermal effects by evaporative cooling and results in mobility modification effects, such as smoothing of patterned films.

DESCRIPTION OF THE PREFERRED EMBODIMENT

The approach in focused laser spike annealing (FLaSk) (first introduced for CARs[5]) is to turn the broad-focus LSA into a tightly focused direct write technique. This introduces several new aspects to the approach with regards to soft matter. The first is the presence of surrounding confinement—polymers can undergo large changes in their mechanical properties and dimensions with even mild increases in temperature, especially if the temperature crosses the glass transition temperature of the polymer; however in a FLaSk process, the heated polymer is always surrounded by rigid polymer at a much lower temperature leading to the potential for very large mechanical strains. The second, following from the first is the presence of large (~1-100 K/µm) thermal gradients.

In the thin (<150 nm) films heated from the substrate (2D FLaSk), it was observed the films would be selectively removed when sufficient heat was applied by thermal induced dewetting. This was observed for polystyrene, polyvinylpyrrolidone, polyvinylacetate, and polystyrene-polydimethylsiloxane block copolymers, and occurred regardless of the substrate, though some key features were affected.

Figure 1:
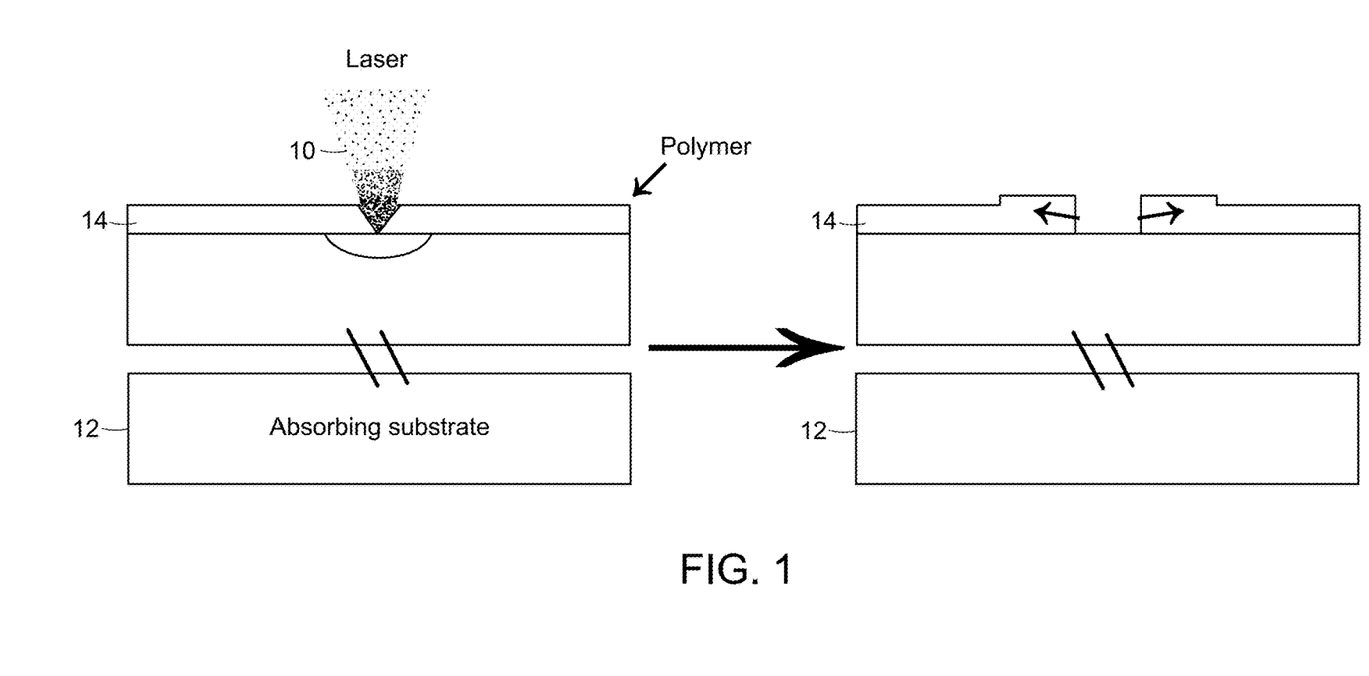
FIG. 1 is a simplified schematic diagram of FLaSk dewetting.

Dewetting has been utilized as a method to generate nanopatterns in thin films of metals[5] and polymers[6] through film-stability-based self-assembly, most generally under near global heat provided by a hotplate or pulsed LSA. In these techniques the driving force is an instability in the surface energy of the film with respect to dewetted droplets leading to the growth of random fluctuations in the film. Recently, a related technique based on the flow of liquids down a thermal gradient (thermocapillarity)[6-10] has been developed to form large area nanopillar arrays.[11,12] The generalized expression for thermocapillary force is:

$$\bar{\tau} \cdot \hat{n} = \frac{d\gamma}{dT} \nabla T \qquad \text{Eq. 1}$$

where $\tau$ is the shear, n the surface normal, and $\gamma$ the surface tension. The surface tension almost always decreases with temperature leading to a net force down a thermal gradient. In the case of the nanopillars, the thermal gradient was generated by using a heated substrate under a thin film, an air gap, and a floated cooled superstrate to create sharp (~50 K/μm) thermal gradients, which drives the formation of the pillars. For the FLaSk technique, the in-plane gradients generated radially from the spot can be equal to or greater than those generated in the pillar technique; however, FLaSk provides these gradients on the micron scale rather than to the whole film at once thus enabling a DW technique. This is shown schematically in FIG. 1.

In FIG. 1, a laser 10 is focused on the surface of an absorbing substrate 12 through a polymer layer 14, generating a hotspot by thermal absorption. The generated thermal gradient and induced melting of the polymer lead to radial dewetting that can be employed in a direct write fashion by translating the relative position of the focused beam.

These temperature effects are enhanced by the polymer film itself which acts as an antireflective coating and thus generates unusual effects during the dewetting depending on the starting thickness of the film. For example, as will be seen, adjacent lines need not all be patterned.

To understand the mechanism of 2D flask dewetting, the temperature of the silicon substrate during line writing must be considered. Determining this is complicated by the fact that the polymer layer acts as an antireflective coating (ARC) for the silicon. To determine the effects of such an ARC, the transfer matrix method is utilized:[13,14]

$$\rho_{ij} = \frac{n_i - n_j}{n_i + n_j} \qquad \text{Eq. 2}$$

$$\tau_{ij} = \frac{n_i - n_j}{n_i + n_j} \qquad \text{Eq. 3}$$

$$\tau_d = e^{-i\frac{2\pi n_2}{\lambda}d} \qquad \text{Eq. 4}$$

$$R = \left| \frac{\rho_{12} + \rho_{12}\tau_d^2}{1 + \rho_{22}\rho_{22}\tau_d^2} \right|^2 \qquad \text{Eq. 5}$$

where i and j are indexes that indicate the layers which the light is propagating from (i) and to (j) in a particular step, n is the index of refraction, d is the ARC thickness, $\lambda$ is the free space wavelength and R is the total reflection after all three layers, being air (1), polymer (2), and silicon (3) are considered. The intermediate values $\rho_{ij}$, $\tau_{ij}$, and $\tau_d$ are the reflection, transmission, and phase shift values through the respective layer pairs or the ARC respectively.

Figure 2A:
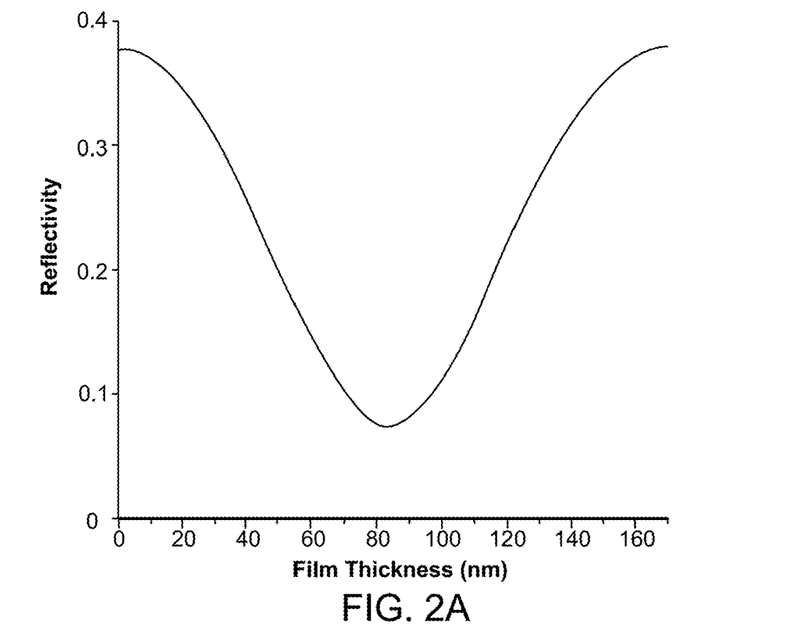
FIG. 2a is a graph of surface reflectivity versus film thickness.
Figure 2B:
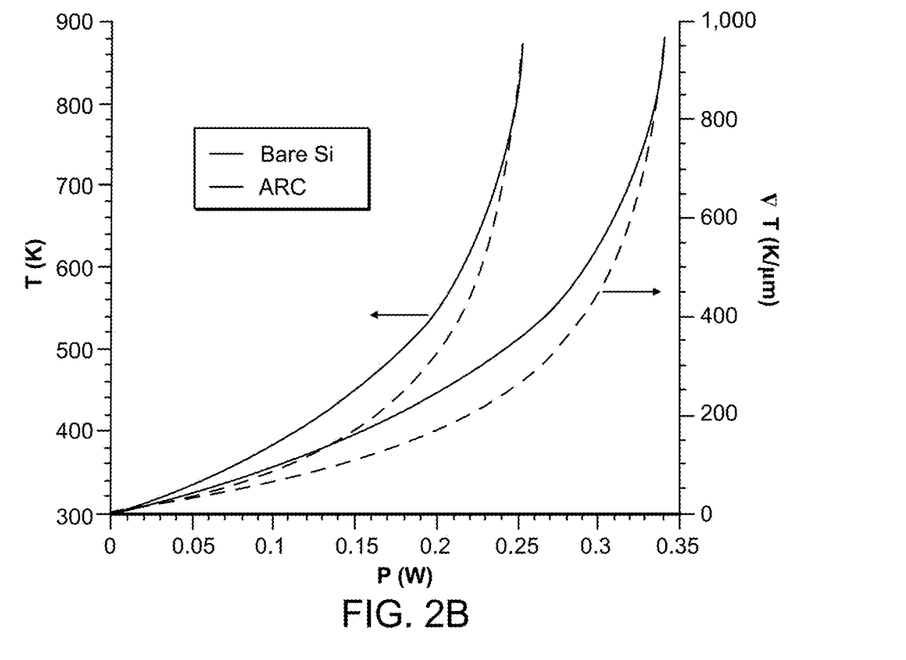
FIG. 2b is a graph of expected peak temperatures (solid) and thermal gradients (dashed) against power.

Taking the polymer layer to be an ARC of index n=1.55 on the silicon with a nominal starting thickness of 60 nm, the reflection determined from Eq. 5 is shown in FIG. 2*a*. With this as a starting point, FEM simulations were utilized to estimate the temperatures and gradients that the polymer would experience during the FLaSk anneal. The thermal profile was analytically modeled as a Gaussian source (NA=0.4) and the optical absorption and heating that would be expected to occur. For materials properties, temperature-dependent values for silicon substrate were utilized for the thermal conductivity, heat capacity, and density.[15] The optical absorption also displays an exponential dependence on temperature, so it was simulated using a previously derived empirical model for near-intrinsic silicon excited with 532 nm light.[16] Finally, the starting point for the absorbed power by the substrate (to be modified by the ARC results) was determined by measuring the damage threshold (about 350-355 mW), which corresponds to a peak temperature of ~1700 K where the silicon surface melts.[17] Using these simulations, it is possible to plot the range of peak temperatures and thermal gradients expected for a given power as the film dewets (FIG. 2*b*). The expected thermal history can be taken as traces through the range of temperatures as the film heats by the moving source and simultaneously thins. This is a highly complex process as the film will heat faster when it is thicker and thus likely thins before peak temperature is reached; however peak gradients, which are spatially in front of the gradients, may be experienced. It can be seen that for the power range employed (about 200-320 mW) gradients of around 100~1000 K/μm, around an order greater than those from vertical dewetting, can be expected.

To achieve a reduction to practice, untreated, silicon substrates were coated with films of polystyrene (PS), hydrogen silsesquioxane (HSQ), polyvinylpyrrolidone (PVP), and polyvinylacetate (PVAc) at various molecular weights to prepare films of various thicknesses in the range of 50-110 nm. Patterning was performed with system with a Coherent RegA 532 nm laser with a free space NA 0.4 objective. Lines shown here were patterned at 270~320 mW at 100 μm/s.

Figure 3A:
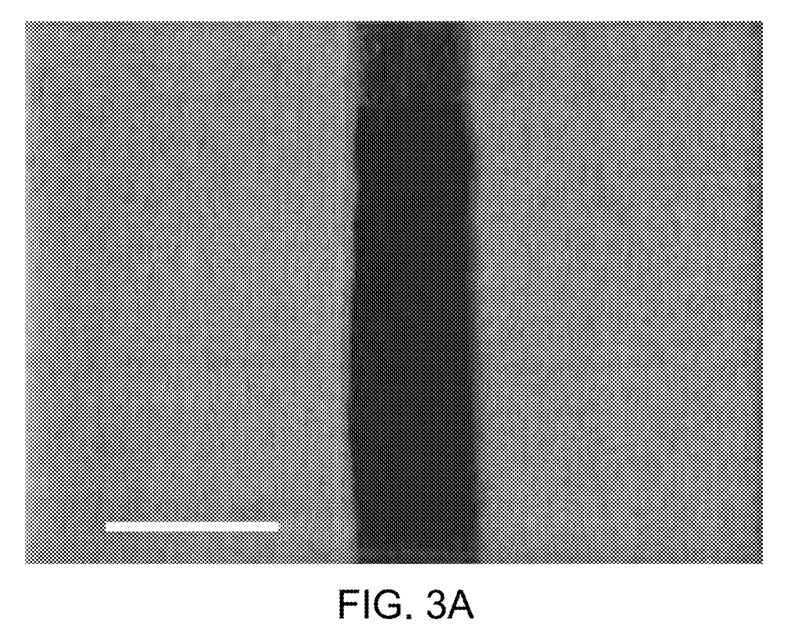
FIG. 3a is an atomic force microscope measurement of an isolated HSQ dewetted line with a 2D profile.
Figure 3B:
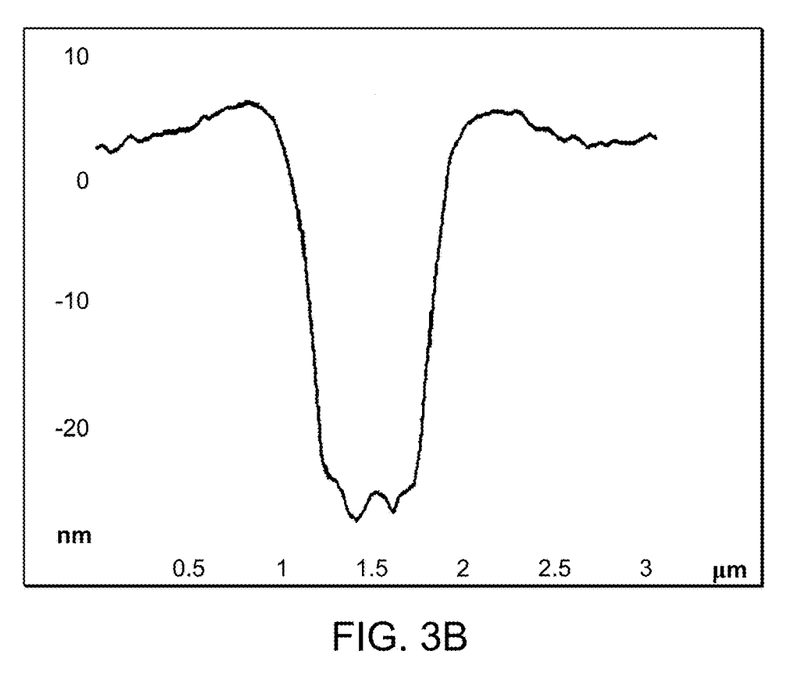
FIG. 3b is an AFM line profile scan illustrating trench depth.

Isolated lines and gratings were patterned. FIG. 3*a*,*b* shows an AFM scan of an isolated HSQ line in a ~50 nm film. It can be seen that the individual lines consist of ~550 nm width trenches bounded by similar sized buildups. The trench depth is ~30 nm, illustrating that complete dewetting of the films, while possible, is not necessary, making this a greyscale patterning process.

Figure 4:
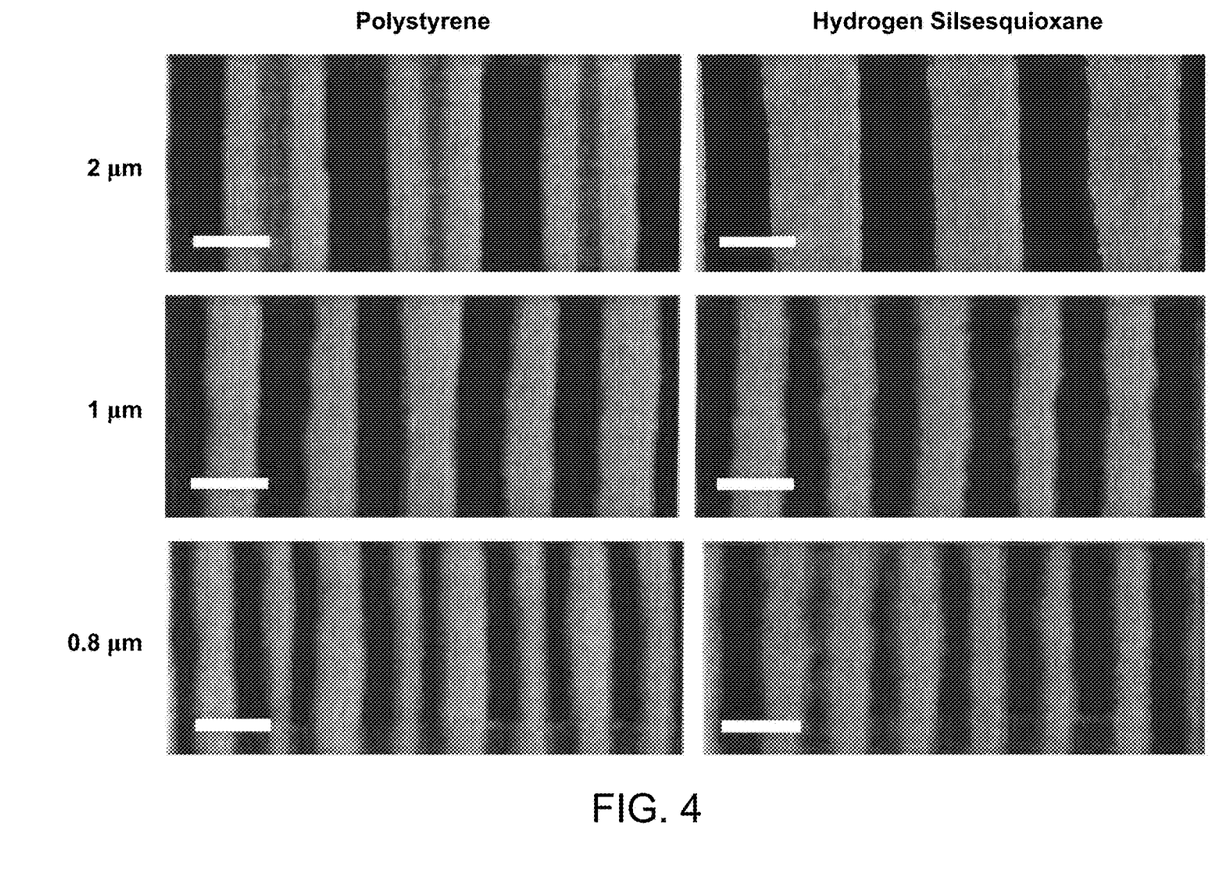
FIG. 4 are photomicrographs showing AFM scans of PS and HSQ lines with various write periodicities.

A distinction between dewetting and ablation is the displacement of material as opposed to its complete removal. Due to this, the patterning behaviour of lines as they approached one another was of considerable interest. FIG. 4 shows the AFM evolution of the written gratings with three pattern periodicities (2 μm, 1 μm, and 0.8 μm) in PS (18 kDa) of thickness ~50 nm. As adjacent lines approach one another, they go through a transition from the isolated line behavior to where the ridges start decreasing in size. After this point, the ridges become the relevant feature as opposed to the trenches as they are now the high resolution feature. At certain spacings, a bifurcation of the pattern occurs where the ridges adopt two line-to-line spacings (in FIG. 4 for PS 0.8 μm spacing, ~780 μm and ~880 μm) and two line widths (in FIG. 4, ~500 nm and ~750 nm). At lower spacings (not shown), another regime can be seen where the smaller ridge disappears and the lines adopt a single line width. The latter leads to periodicities disparate from the patterning periodicity, due to patterning roughly every other line. This indicates that the mechanism that leads to their formation is more complex than the simple linear combinations of multiple line patterns. This shows that developer free, ultrahigh resolution patterning is feasible with both ubiquitous polymers and small molecules without using a high numerical aperture or multiphoton effects.

Dewetting of thin films as a positive tone process through FLaSk heating of the substrate is a relatively nascent technique and has only really begun to show its potential for development-free positive tone patterning of 1D or (barring overlap) 2D structures. As currently presented, it exists in two distinct forms: (1) patterning of isolated trench-ridge lines near the optical limit and (2) patterning of subwavelength lines by overlapping the exposures. While capability (2) is more exotic, capability (1) should not be diminished; submicron 2D DW in a method that requires no developer step and only uses inexpensive, commodity polymers, free space optics, and visible (subwatt) lasers could be a potentially competitive process, especially for industrial scale fabrication tools where price is a critical concern. Ironically, the presence of the overlap effects that allow for (2) is the major limitation of this technique: patterning any feature wider than a single line or crossing another feature will be complicated by the overlap effects. This could potentially be addressed by changing the focus, which is an effective way to alter spot size and programming intricate focus, power, position paths to make desired features, not unlike how 3D laser printers currently operate. This is a problem of optimization and software that could be approached in future; however, one way to limit these effects is to increase the resolution of patterning. This could be accomplished via the usual methods of increasing the NA or decreasing the wavelength, but the efficacy of such a strategy would be limited by the coupled thermal effects. Moreover, any increase in NA lowers the scalability by lowering the working distance and field of view. Instead, it would be desirable to increase the resolution by limiting the thermal spread, which is possible, by the incorporation of solvent for evaporative cooling. Another possible manipulation is the thermal or etching properties of the utilized polymer. Finally, it would be desirable to be able to use this positive tone process for liftoff rather than just etching.

Figure 5:
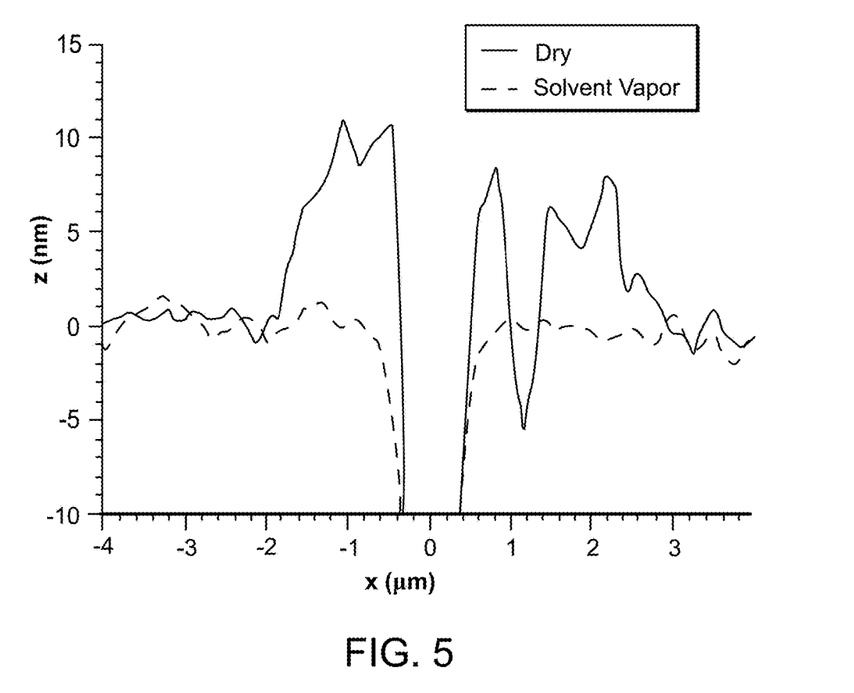
FIG. 5 are AFM line profile scans of dewetted PS-PDMS BCP lines patterned with and without PS-selective solvent vapor.

Swelling the film with solvent is one way to improve the process. The effects of solvent in can be shown to limit the extent of thermal excitation, thereby increasing thermal gradients for enhanced patterning. In fact, the dewetting lines in the solvent exposed PS-PDMS BCP possessed resolutions often much greater (~200-600 nm) than those observed in the single PS-only lines. Furthermore, the incorporation of solvent was observed to smooth the surrounding ridges (FIG. 5), which could allow for limited line-to-line interactions. In addition, the quality of lines patterned in FIG. 5 were enhanced by the utilization of a PS-brush which was observed to increase the uniformity of the dewetting of the BCP.

Figure 6A:
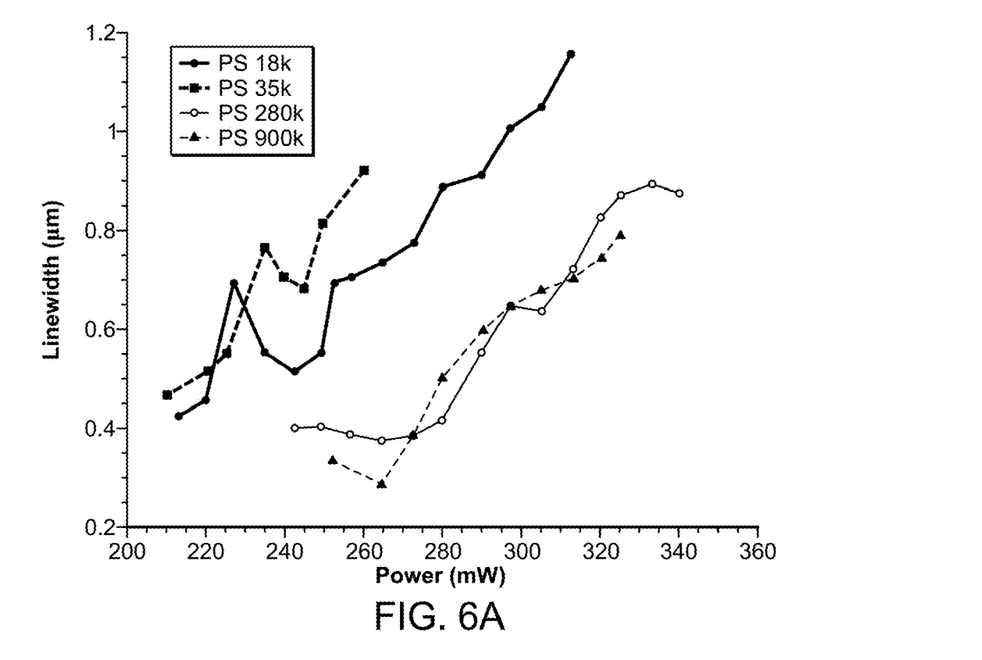
FIG. 6a are observed linewidths of PS films of different molecular weight extracted from AFM scans.

The selection of polymer can have a large effect on the final pattern generated by FLaSk dewetting. FIG. 6a shows the effects on linewidth of the glass transition temperature as one example. This information can be used in the other direction, i.e. the shape of the line profile resulting from FLaSk dewetting can be utilized to determine the properties of the dewetted film.

Figure 6B:
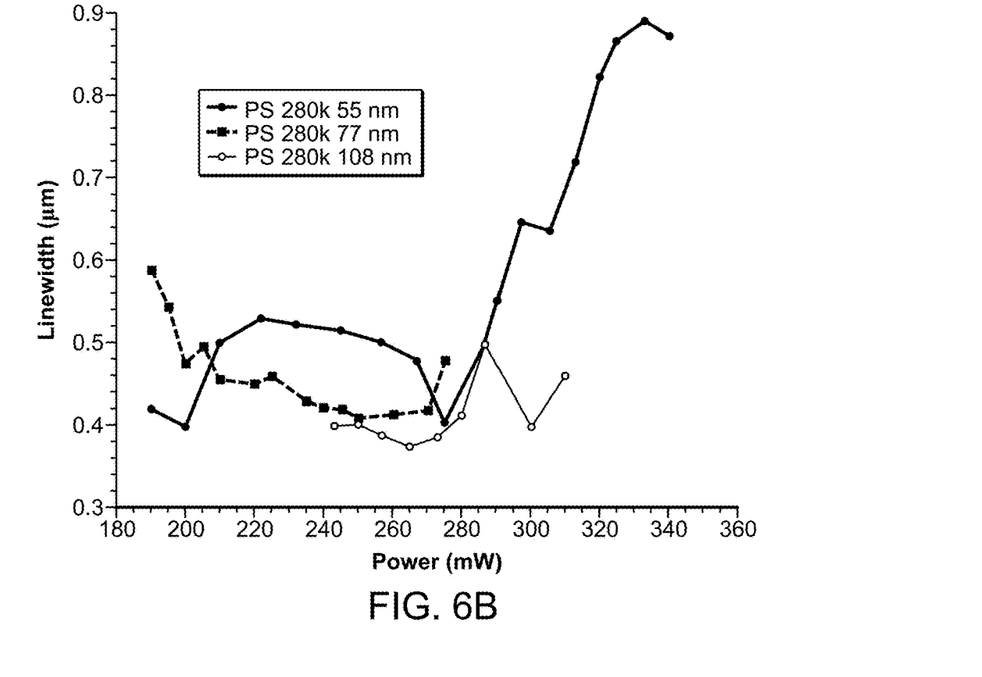
FIG. 6b are observed linewidths of PS films of different thicknesses extracted from AFM scans.

The thickness of the film will also affect the antireflection aspects of the patterning with FIG. 6b showing the dewetting of PS films at three different thicknesses which are at select points of the antireflection curve in FIG. 2a. For example, films patterned near the minimum reflectivity thickness are relatively narrow and stable over large ranges of laser power.

Figure 7:
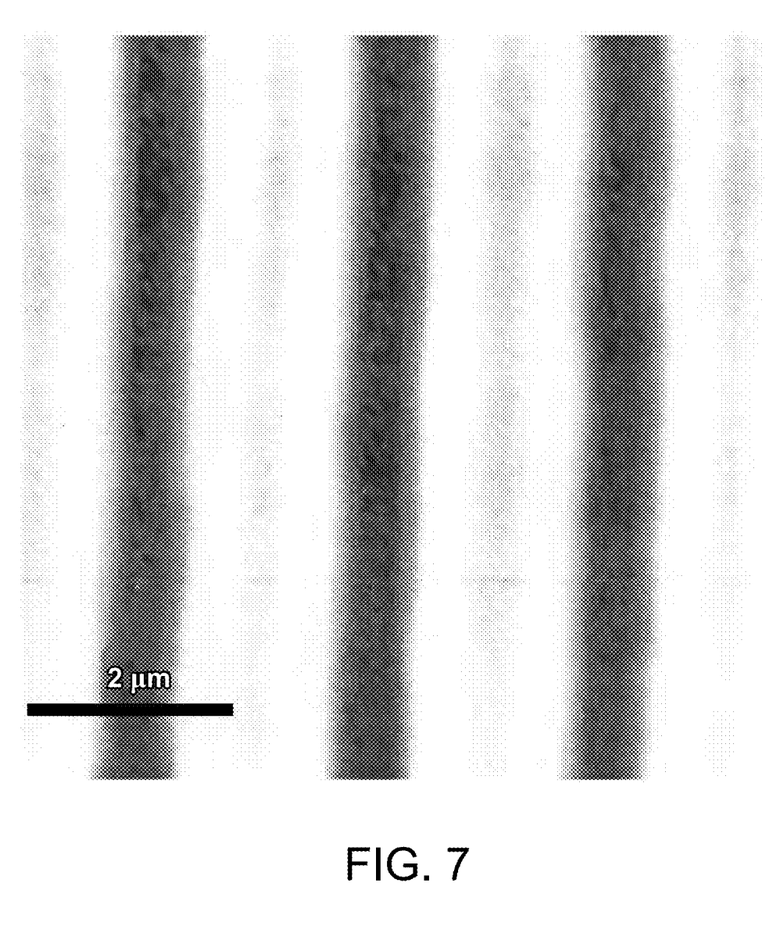
FIG. 7 is a photomicrograph of an AFM scan of a dewetted PS film derived from a commercial polystyrene cup.
Figure 8A:
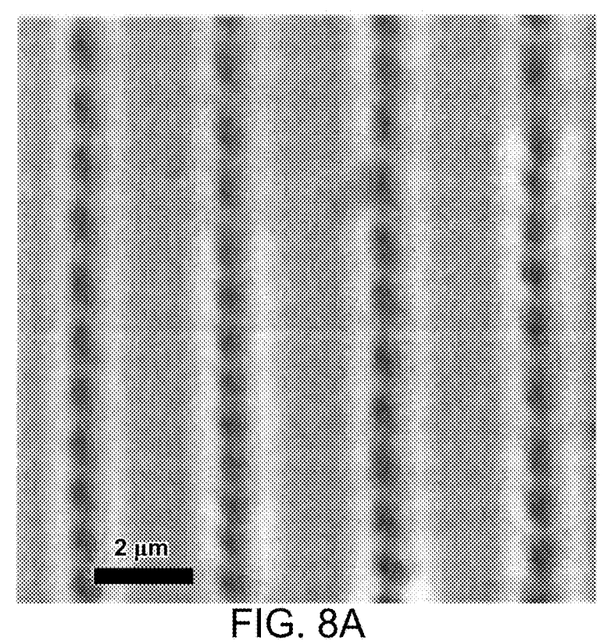
FIG. 8a,b are photomicrographs of AFM scans of a dewetted PS/PVP bilayer forming lines of dots. (b) is patterned a higher power resulting in deeper features of the same size, but with more dots per length.
Figure 8B:
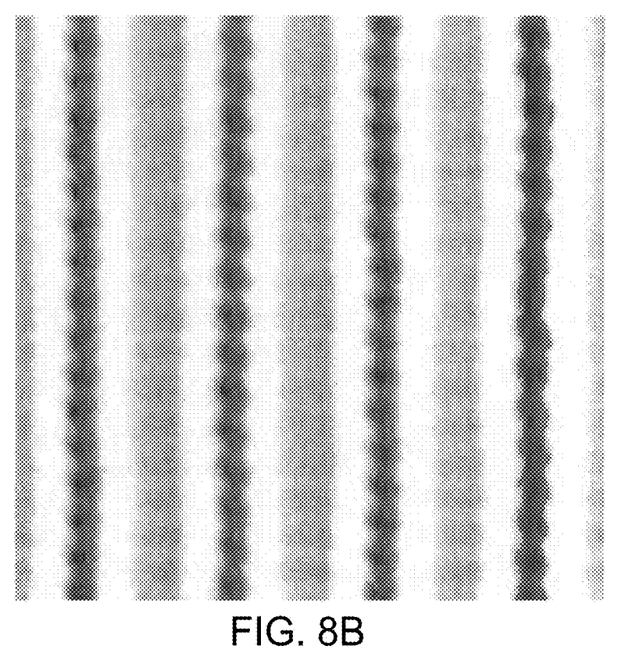
Figure 9A:
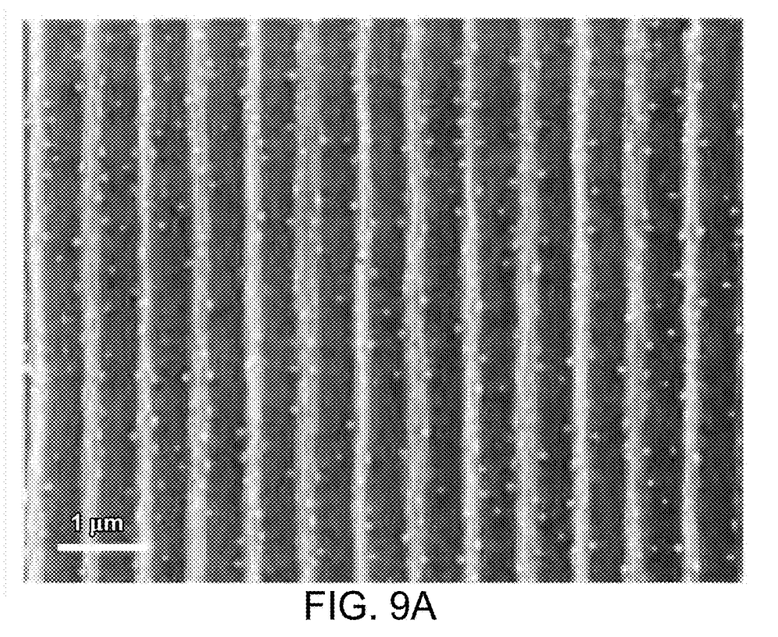
FIG. 9a,b are scanning electron micrographs of silicon patterns produced by etching of dewetted PVP/PVP nanoparticle films, (a) is patterned at a lower power showing little effect on the particles (b) is patterned at a higher power showing the ability to remove the particles with higher temperature degradation.
Figure 9B:
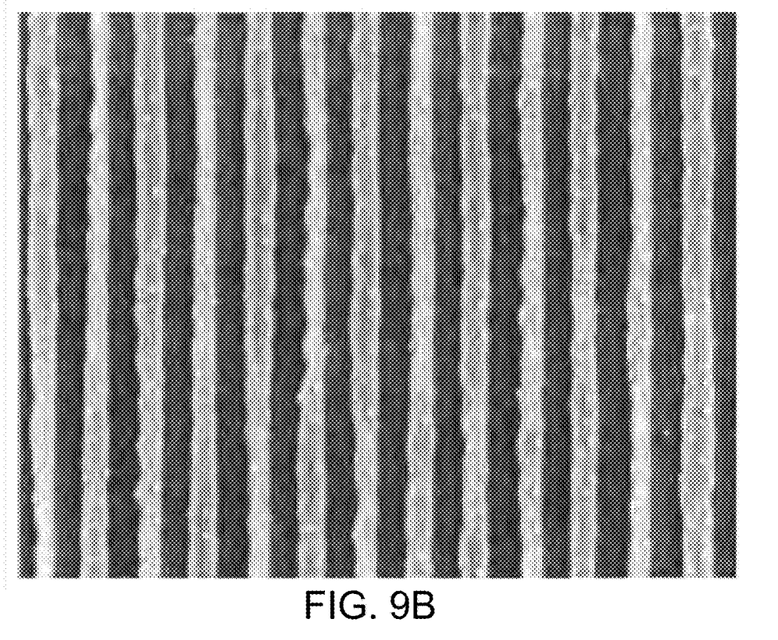

Discussion to this point has referred to films of single composition. This technique is not limited, however, to homogeneous films. For example, FIG. 7 shows patterning in a film obtained from a recycled polystyrene cup which was only purified by particulate filtration, demonstrating the ability to utilize highly polydisperse, waste polymers. Furthermore, the use of bilayers has been shown to lead to other unique methods of patterning, such as the evolution of chains of near-circular dots that emerge in a stack of ~50 nm PVP (630 kDa) on ~50 nm PS (30 kDa) which appear to vary in their frequency in the line with power (FIG. 8). This represents a method of obtaining 2D patterns from a 1D line writing process without even overlap effects. Another possible modification is the incorporation of nanoparticles into the film. FIG. 9 shows the pattern resulting from the etching of a PVP film with PVP nanoparticles incorporated. At low power, the particles are relatively unaffected by the dewetting, but at higher powers they are burnt away. This indicates a method for both the exposure of embedded particles for patterning and also a method for cleaning of the patterned lines from unwanted particulate impurities.

Figure 10:
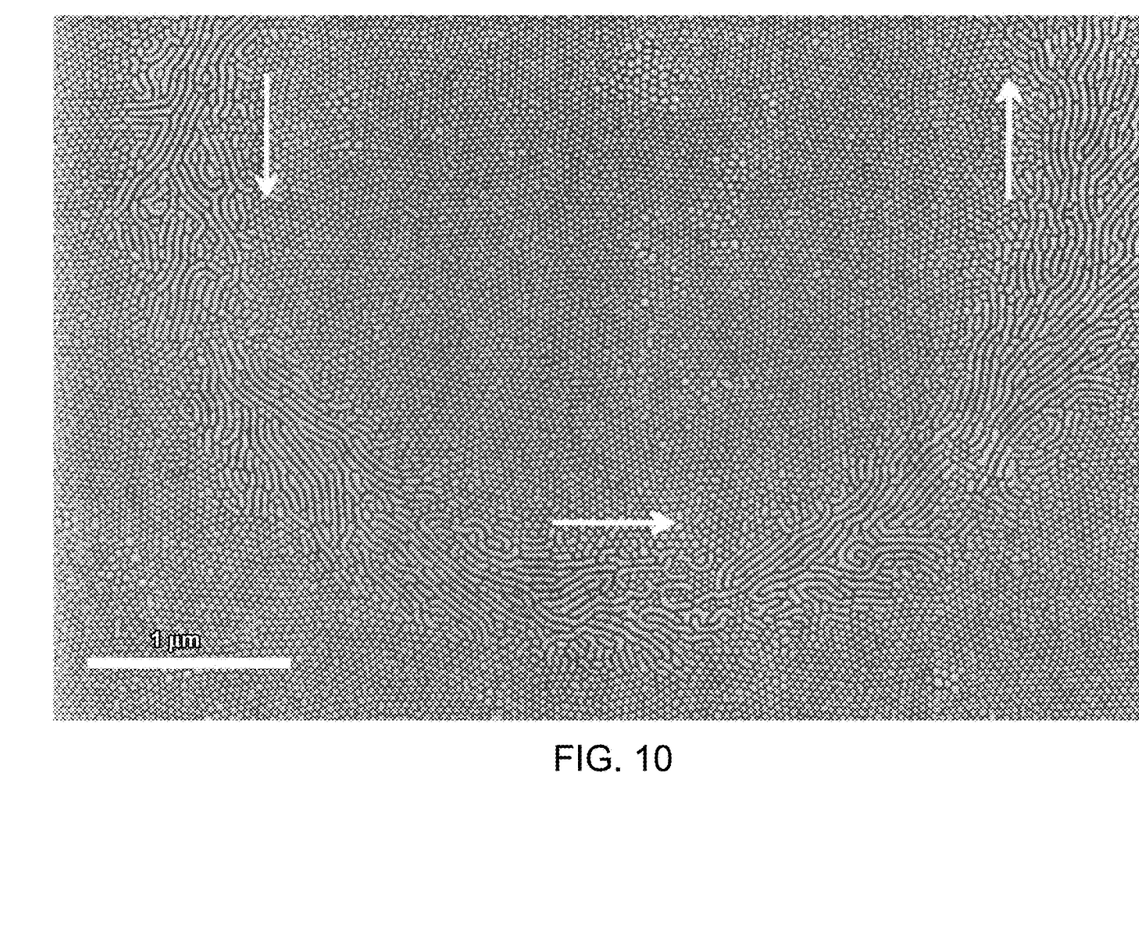
FIG. 10 is a scanning electron micrograph of a PS-PDMS BCP film with a partially dewetted circular path patterned with solvent vapor. The BCP microphase (here, cylindrical) is both annealed and aligned along the direction of the write path. Image made possible by plasma etching of the PS.

The heated portions of the film, whether completely or partially dewetted, undergo large thermal shears. These can, in turn, induce other structural effects. For example, in the films patterned by FLaSk of the PS-PDMS block copolymer, the thermally-induced shear has also been observed to reside in alignment of the microdomains of the PDMS (FIG. 10).[18]

The technology disclosed herein may be of interest to companies that make 2D laser direct write platforms, as a possible method to make a low cost system to market to customers that are interested in batch processing at minimal cost per unit. A system designed to do 2D patterning by a dewetting mechanism can reach competitive resolutions with current systems without the need for several key attributes: (1) photosensitive media, (2) post-exposure baking, and (3) development. Step (1) has two distinct implications: (1.i) Polymers for dewetting can be much cheaper than photoresist polymers (lab grade polystyrene is ~$ 0.20 per gram (which is 2 wt % of the solution) and coating solvent is ~$ 0.05 per mL compared to ~$2 per mL of a typical photoresist) and (1.ii) lab facilities where photosensitive media are handled often must be dark-room-like environments or exposure limits must be enforced. Step (2) simply reduces the number of steps. Step (3) can be a major cost consideration as labs where development requires both (3.i) a large supply of fresh developer and also (3.ii) the means to dispose of used developer. Removal of this step could present a large reduction in both the chemical costs and also the environmental footprint of a facility. Beyond equipment companies, companies who do their own in-house patterning, such as those who manufacture photomasks and stamps could employ this method in a custom system to produce custom grating structures in a much more affordable fashion. In addition, as the specific morphology of feature depends on the polymer parameter, this technique may be adapted as a form of metrology for determination of polymer behaviors under high thermal gradients and rapid heating.

The superscript numbers refer to the references listed herein. The contents of all of these references are incorporated herein by reference.

REFERENCES

1 Gat, A, et al. CW LASER ANNEAL OF POLYCRYSTALLINE SILICON-CRYSTALLINE-STRUCTURE, ELECTRICAL-PROPERTIES. *App. Phys. Lett.* 33, 775-778 (1978).

2 Jaw-Luen, T. & Ming-An. T. Rapid formation of block copolymer thin film based on infrared laser irradiation. *CLEO-PR* 2007, ThP_082 (2007).

3 Jung, B. et al. Sub-millisecond post exposure bake of chemically amplified resists by $CO_2$ laser heat treatment. *Proc. of SPIE* 7639, 76390L-76399 (2010).

4 Singer, J. P., et al. Direct-Write Thermocapillary Dewetting of Polymer Thin Films by a Laser-Induced Thermal Gradient. *Advanced Materials* 25, 6100-6105 (2011).

5 Singer, J. P., Kooi, S. E. & Thomas, E. L. Focused laser spike (FLaSk) annealing of photoactivated chemically amplified resists for rapid hierarchical patterning. *Nanoscale* 3, 2730-2738(2011).

6 Trice. J., Thomas, D., Favazza, C., Sureshkumar, R. & Kalyanaraman, R. Pulsed-laser-induced dewetting in nanoscopic metal films: Theory and experiments. *Physical Review B* 75, 235439 (2007).

7 Du, B., Xie, F., Wang, Y., Yang, Z. & Tsui, O. K. C. Dewetting of Polymer Films with Built-in Topographical Defects. *Langmuir* 18, 8510-8517 (2002).

8 Brochard, F. Motions of droplets on solid surfaces induced by chemical or thermal gradients. *Langmuir* 5, 432-438 (1989).

9 Ludviksson, V. & Lightfoot, E. N. The dynamics of thin films in the presence of surface-tension gradients. *AIChE J.* 17, 116-1173 (1971).

10 Darhuber, A. A., Valentino, J. P., Davis, J. M., Troian, S. M. & Wagner, S. Microfluidic actuation by modulation of surface stresses. *Appl. Phys. Lett.* 82, 657-659 (2003).

11 McLeod, E., Liu, Y. & Troian, S. M. Experimental Verification of the Formation Mechanism for Pillar Arrays in Nanofilms Subject to Large Thermal Gradients. *Phys. Rev. Lett.* 106, 175501 (2011).

12 Dietzel, M. & Troian, S. M. Mechanism for spontaneous growth of nanopillar arrays in ultrathin films subject to a thermal gradient. *J. Appl. Phys.* 108, 074308-074317 (2010).

13 Dammel, R. R. & Norwood, R. A. Modeling of bottom antireflection layers: sensitivity to optical constants. 754-769, doi: 10.1117/12.241874 (1996).

14 Rathsack, B. M., Tabery, C. E., Philbin, C. E. & Wilison, C. G. in *BACUS Symposium on Photomask Technology*. (SPIE).

15 Shanks, H. R., Maycock, P. D., Sidles, P. H. & Danielson, G. C. Thermal Conductivity of Silicon from 300 to 1400° K. *Physical Review* 130, 1743-1748 (1963).

16 Jellison, J. G. E. & Modine, F. A. Optical absorption of silicon between 1.6 and 4.7 eV at elevated temperatures, *Appl. Phys. Lett.* 41, 180-182 (1982).

17 Lo, H. W. & Compaan, A. Raman measurements of temperature during cw laser heating of silicon. *J. Appl. Phys.* 51, 1565-1568 (1980).

18 Singer, J. P. et al. Alignment And Reordering of a Block Copolymer by Solvent-Enhanced Thermal Laser Direct Write. *Polymer* 55, 1875-1882 (2014).

What is claimed is:

1. A method for lithographic patterning of thin films comprising:
   depositing a film of less than about 500 nm thickness of material containing at least one non-metallic component on a substrate; and
   exposing an area of the film to optical energy from a focused laser to induce a thermal gradient in the film by optical absorption, the thermal gradient being in the range of about 1 K/µm to 1000 K/µm,
   wherein the film is softened through a melting or glass transition process and the thermal gradient induces a directional dewetting along the thermal gradient to displace at least portions of the exposed area of the film from initial locations with respect to the substrate to new locations with respect to the substrate, the new locations being on the substrate or the film.

2. The method of claim 1 wherein the thermal gradient arises from the optical absorption of the substrate.

3. The method of claim 1 wherein the focused laser has a selected focal shape.

4. The method of claim 3 wherein the selected focal shape is selected from the group consisting of profiles including Gaussian or toroidal.

5. The method of claim 1 further including exposures that overlap or are adjacent to existing features.

6. The method of claim 5 where the overlapped exposures are regions of the film of differing thickness to produce antireflection effects to generate hotspots and the dewetting away from main focus.

7. The method of claim 6 where the differing thickness is produced by a previous exposure.

8. The method of claim 1 wherein the film is heated or cooled on a length scale greater than a focal spot size of the laser to effect a patterned thermal profile.

9. The method of claim 8 wherein the film is heated or cooled with a thermoelectric platform.

10. The method of claim 1 wherein the film comprises multiple layers having different properties.

11. The method of claim 10 wherein the directional dewetting of the film includes the multiple layers dewetting at different temperature dependent rates without mixing.

12. The method of claim 1 further including the film having nanoparticles incorporated therein.

13. The method of claim 1 wherein the film is exposed to a solvent vapor to control patterning effects by effects including but not limited to evaporative cooling and surface smoothing.

14. The method of claim 13 wherein the solvent vapor selectively swells one or more components of the film.

15. The method of claim 1 where properties of the substrate are altered to influence the dewetting behavior.

16. The method of claim 15 where the properties of the underlying substrate are altered by surface functionalization with a polymer brush or self-assembled monolayer.

17. The method of claim 1 where the dewetting is incomplete, leaving the substrate coated by some thickness of the film.

18. The method of claim 1 wherein the film is a polymer or organic molecule of thickness less than about 100 nm.

19. The method of claim 18 wherein the film is a block copolymer.

20. The method of claim 2 wherein the substrate is a semiconductor whose optical energy absorption leads to thermal heating and the thermal gradient.

21. The method of claim 1 where a relative position of a focused spot of the laser is moved with respect to the film by either motion of the spot or motion of the substrate.

22. The method of claim 1 further including using a patterned film as a plasma etch mask for the substrate.

23. The method of claim 1 where the morphology of a dewetted feature is used to determine the properties of the film.

24. The method of claim 1 wherein the focused laser has a spot size less than about 25 µm.

25. The method of claim 1 further including adjusting a power output of the focused laser to regulate a distance between the initial location and the new location, the displaced film being patterned at the new location.

26. The method of claim 1 wherein a power of the focused laser is in the range of about 200 mW to about 320 mW.

27. The method of claim 26 wherein the thermal gradient is in the range of about 50 K/µm to 1000 K/µm.

28. The method of claim 27 wherein the thermal gradient is in the range of about 100 K/µm to 1000 K/µm.

29. The method of claim 1, wherein the directional dewetting comprises radial dewetting to move the at least portions of the exposed area of the film radially away from a location at which the focused laser is applied.

30. The method of claim 1, wherein the focused laser employs a continuous output while exposing the area of the film to optical energy from a focused laser to induce a thermal gradient in the film by optical absorption.

31. The method of claim 1, wherein a time period during which exposing an area of the film to optical energy from a focused laser to induce a thermal gradient in the film by optical absorption is sufficient to both increase a temperature of the exposed area of the film and set the at least portions of the exposed area of the film that are displaced in motion towards the new locations.

32. The method of claim 1, wherein exposing an area of the film to optical energy from a focused laser to induce a thermal gradient in the film by optical absorption occurs for a time period of at least 8.5 milliseconds.

33. The method of claim 1 further including at least one or more additional films, at least one of the film and the one or more additional films having nanoparticles incorporated therein.

\* \* \* \* \*